(12) United States Patent
Sinha et al.

(10) Patent No.: US 11,742,846 B1
(45) Date of Patent: Aug. 29, 2023

(54) SEMICONDUCTOR SWITCHES FOR HIGH VOLTAGE OPERATIONS

(71) Applicant: Texas Instruments Incorporated, Dallas, TX (US)

(72) Inventors: Rohan Sinha, Bengaluru (IN); Rajat Kulshrestha, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/847,917

(22) Filed: Jun. 23, 2022

(51) Int. Cl.
*H03K 17/10* (2006.01)
*H03K 19/0185* (2006.01)

(52) U.S. Cl.
CPC ... *H03K 17/102* (2013.01); *H03K 19/018521* (2013.01); *H03K 2217/0054* (2013.01)

(58) Field of Classification Search
CPC .................................................. H03K 17/102
USPC ......................................................... 327/108
See application file for complete search history.

(56) References Cited

U.S. PATENT DOCUMENTS

2012/0126736 A1\* 5/2012 Leung ................ H03K 17/0822
318/400.28

\* cited by examiner

*Primary Examiner* — Tomi Skibinski
(74) *Attorney, Agent, or Firm* — Yudong Kim; Frank D. Cimino

(57) ABSTRACT

Semiconductor switches for high voltage operations are described. The semiconductor switch includes a first DE-NMOS FET including a gate coupled to a node of the switch with its source and drain coupled to input and output nodes, respectively. The switch also includes a second DE-NMOS FET with a drain coupled to the node. A gate of the second DE-NMOS FET is configured to receive a signal enabling or disabling the switch. The switch includes a voltage source (e.g., a voltage-controlled voltage source) coupled to the node, which supplies a first voltage at the node. The first voltage is greater than a second voltage at the input node by a predetermined amount such that the first DE-NMOS FET may operate within a safe operating area while supporting high voltage operations. The switch also includes a current source configured to supply current to the voltage source.

42 Claims, 7 Drawing Sheets

SEMICONDUCTOR SWITCHES FOR HIGH VOLTAGE OPERATIONS

TECHNICAL FIELD

The present disclosure generally relates to the field of semiconductor devices, and more particularly to semiconductor switches for high voltage operations.

BACKGROUND

Semiconductor devices may include voltage level shifting circuits that generate high voltage signals to support operations requiring voltages greater than supply voltages to the semiconductor devices. When the high voltage signals are transferred from the voltage level shifting circuits to various components of the semiconductor devices, it would be desirable to have switches that can handle the high voltages without causing reliability or functionality concern.

SUMMARY

The present disclosure describes semiconductor switches for high voltage operations. The switches include n-channel and/or p-channel diffusion-enhanced metal-oxide-semiconductor field effect transistors (DE-MOS FETs). The DE-MOS FETs include graded junctions for supporting relatively high voltage signals, among other features. The present disclosure describes circuits providing safe operating conditions for such DE-MOS FETs included in semiconductor switches for high voltage operations. This summary is not an extensive overview of the disclosure, and is neither intended to identify key or critical elements of the disclosure, nor to delineate the scope thereof. Rather, the primary purpose of the summary is to present some concepts of the disclosure in a simplified form as a prelude to a more detailed description that is presented later.

In some embodiments, a circuit includes a DE-NMOS FET including a gate coupled to a node of the circuit, where a source and a drain of the DE-NMOS FET are coupled to an input node and an output node of the circuit, respectively; a voltage source coupled to the node, where the voltage source is configured to provide a first voltage at the node, the first voltage greater than a second voltage at the input node by a predetermined amount; and a current source coupled to the node, the current source configured to supply current to the voltage source.

In some embodiments, a circuit includes a first component including an output node, the first component configured to generate a first voltage at the output node; a second component coupled to a power supply node, the second component configured to operate with the first voltage; and a first switch connected between the output node and the power supply node, where the first switch includes: a first DE-NMOS FET including a gate coupled to a first node of the first switch, where a source and a drain of the first DE-NMOS FET are coupled to the output node and the power supply node, respectively; a first voltage source coupled to the first node, where the first voltage source is configured to generate a second voltage greater than the first voltage by a first predetermined amount; and a first current source coupled to the first node, the first current source configured to supply first current to the first voltage source.

In some embodiments, a method includes determining to supply a first voltage or a second voltage to a power supply node of a component; and enabling either a first switch configured to couple the first voltage to the power supply node or a second switch configured to couple the second voltage to the power supply node based at least in part on the determination, where each of the first and second switch includes: a DE-NMOS FET having a gate coupled to a node of the switch, where a source and a drain of the DE-NMOS FET is coupled to an input node and an output node of the switch, respectively; a voltage source coupled to the node, where the voltage source is configured to generate a voltage greater than an input voltage of the input node by a predetermined amount; and a current source coupled to the node, the current source configured to supply current to the voltage source.

DETAILED DESCRIPTION

Figure 1A:
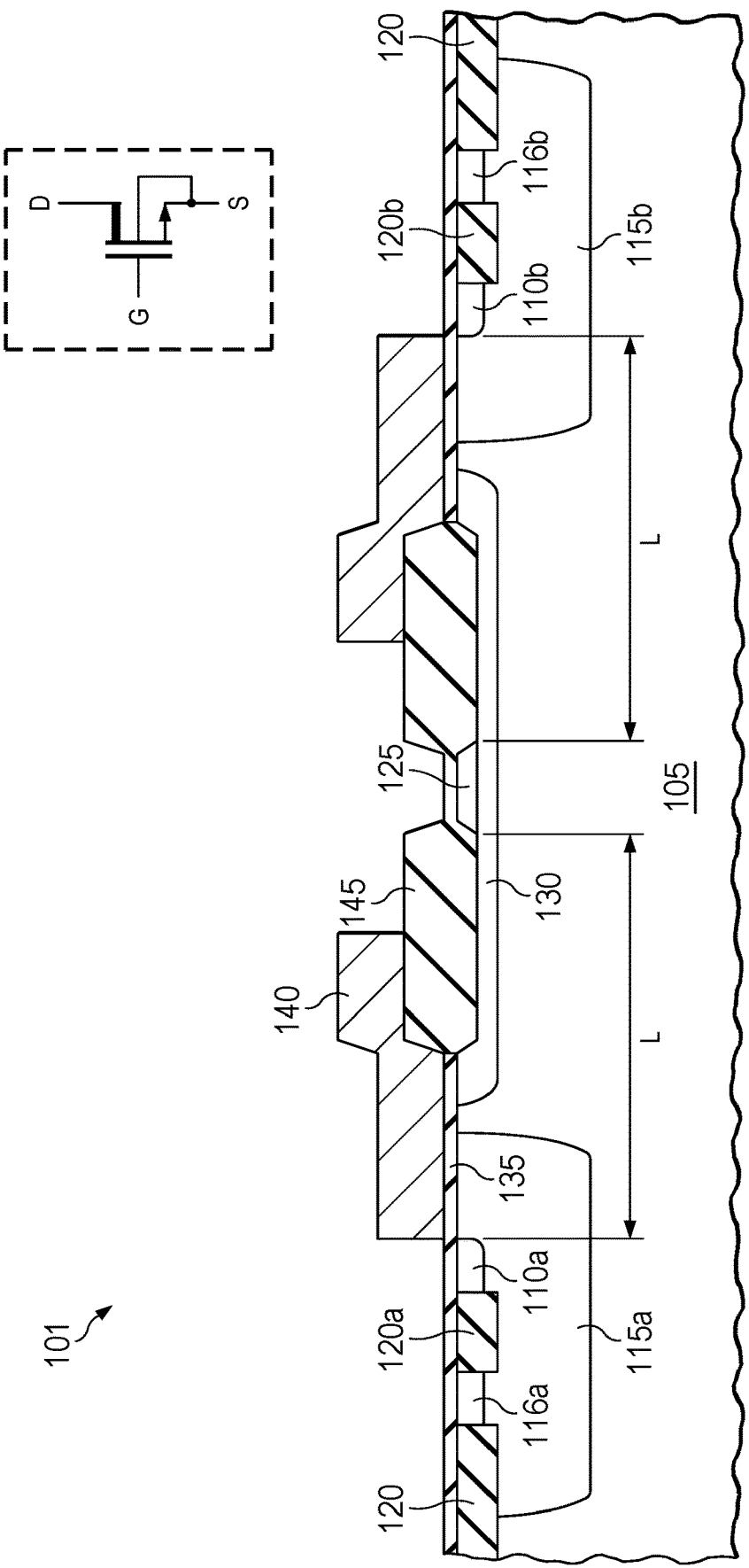
FIGS. 1A and 1B illustrate cross-sectional schematic diagrams of diffusion-enhanced MOS FETs in accordance with embodiments of the present disclosure.

The present disclosure is described with reference to the attached figures. The components in the figures are not drawn to scale. Instead, emphasis is placed on clearly illustrating overall features and the principles of the present disclosure. Numerous specific details and relationships are set forth with reference to example embodiments of the figures to provide an understanding of the disclosure. It is to be understood that the figures and examples are not meant to limit the scope of the present disclosure to such example embodiments, but other embodiments are possible by way of interchanging or modifying at least some of the described or illustrated elements. Moreover, where elements of the present disclosure can be partially or fully implemented using known components, those portions of such components that facilitate an understanding of the present disclosure are described, and detailed descriptions of other portions of such components are omitted so as not to obscure the disclosure.

Various structures disclosed herein can be formed using semiconductor process techniques. Layers including various materials can be formed over a substrate, for example, using deposition techniques (e.g., chemical vapor deposition, physical vapor deposition, atomic layer deposition, spin coating, plating), thermal process techniques (e.g., oxidation, nitridation, epitaxy), and/or other suitable techniques. Similarly, some portions of the layers can be selectively removed, for example, using etching techniques (e.g., plasma (or dry) etching, wet etching), chemical mechanical planarization, and/or other suitable techniques, some of which may be combined with photolithography steps.

Semiconductor devices, integrated circuits, or IC components described herein may be formed on a semiconductor substrate (or die) including various semiconductor materials, such as silicon, germanium, silicon-germanium alloy, gallium arsenide, gallium nitride, silicon carbide, or the like. In some cases, the substrate refers to a semiconductor wafer. The conductivity (or resistivity) of the substrate (or regions of the substrate) can be controlled by doping techniques using various chemical species (which may also be referred to as dopant atoms) including, but not limited to, boron, indium, arsenic, or phosphorus. Doping may be performed during the initial formation or growth of the substrate (or an epitaxial layer grown on the substrate), by ion-implantation, or other suitable doping techniques.

As used herein, terms such as "first" and "second" are used to arbitrarily distinguish between the elements such terms describe. Thus, these terms in the description and in the claims are not intended to indicate temporal or other prioritization of such elements. Moreover, terms such as "front," "back," "top," "bottom," "over," "under," "vertical," "horizontal," "lateral," "down," "up," "upper," "lower," or the like, are used to refer to relative directions or positions of features in the semiconductor devices in view of the orientation shown in the figures. For example, "upper" or "uppermost" can refer to a feature positioned closer to the top of a page than other features. It is to be understood that the terms so used are interchangeable under appropriate circumstances such that the embodiments of the technology described herein are, for example, capable of operation in other orientations than those illustrated or otherwise described herein.

DE-MOS FETs can be used in a variety of high voltage circuits supporting high voltage operations, for example, input/output interface circuits with various off-chip modules, analog input circuits conditioning signals from transducers (e.g., thermometers, pressure sensors, microphones), analog output circuits for driving other actuators (e.g., electro/mechanical actuators, piezoelectric actuators), or the like. In certain applications, DE-MOS FETs may be included in high voltage circuits operating with 20 V, 30 V, or even higher (e.g., 48 V or so).

The present disclosure describes semiconductor switches for high voltage operations. The semiconductor switches include n-channel and/or p-channel DE-MOS FETs (which may also be referred to as DE-NMOS FETs and DE-PMOS FETs, respectively). The DE-MOS FETs may include drain junctions with graded dopant diffusion profiles, which may be referred to as drift or laterally diffused drain regions. Moreover, the DE-MOS FETs may include field oxides in the diffused drain regions, over which portions of gate electrodes are located. The field oxide may be configured to provide a greater distance between the drain regions and the gate electrodes than the gate oxide. In this manner, the DE-MOS FETs may safely operate with relatively high voltages applied to the drain regions.

The DE-MOS FETs, however, may not have similarly configured source regions—e.g., source junctions with graded dopant profiles, field oxides distancing the source regions away from the gate electrodes. As a result, the DE-MOS FETs may have a breakdown voltage across the gate and the source (BVgs) that is less than a breakdown voltage across the drain and the source (BVds) or a breakdown voltage across the gate and the drain (BVgd). In some embodiments, the DE-MOS FETs have BVgs of approximately 6 V while BVds (and/or BVgd) of the DE-MOS FETs may be approximately 20 V, or greater.

The semiconductor switches described in the present disclosure include circuits configured to provide a safe operating area (SOA) for the DE-MOS FETs. For example, the circuits maintain voltages across gate and source (Vgs) of the DE-MOS FETs to be less than their BVgs such that the DE-MOS FETs can operate within the SOA. The switches can be used to couple high voltage (HV) signals (e.g., internally generated HV signals by voltage level shifters) to various components utilizing the HV signals (e.g., an array of electrically erasable programmable read-only memory (EEPROM) cells). The switches can also be used to couple externally supplied HV signals to the components. Moreover, the switches can selectively couple the high voltage components to the internally generated HV signals or the externally supplied HV signals. In this manner, the switches can provide flexibility as to operating (or validating) the high voltage components under normal operating conditions (e.g., the EEPROM cells coupled to the voltage level shifters) or characterizing (or de-bugging) the high voltage components under special test conditions— e.g., characterizing the EEPROM cells by using the externally supplied HV signals.

Figure 1B:
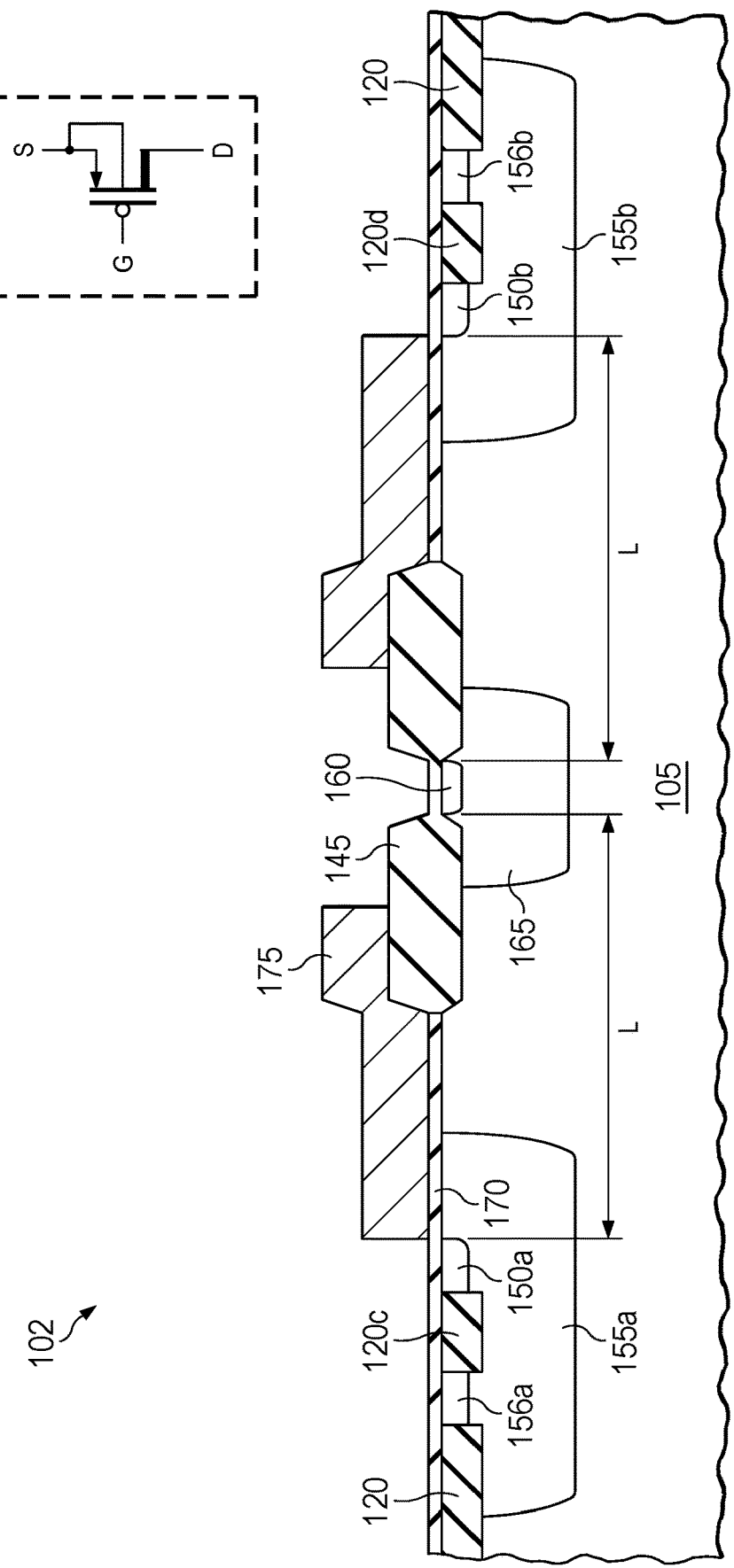

FIGS. 1A and 1B illustrate cross-sectional schematic diagrams of diffusion-enhanced MOS FETs in accordance with embodiments of the present disclosure. FIG. 1A is a cross-sectional schematic diagram of a diffusion-enhanced n-channel MOS FET 101 (a DE-NMOS FET with a circuit symbol shown in the inset of FIG. 1A). FIG. 1B is a cross-sectional schematic diagram of a diffusion-enhanced p-channel MOS FET 102 (a DE-PMOS FET with a circuit symbol shown in the inset of FIG. 1B).

The DE-NMOS FET 101 includes a substrate 105. In some embodiments, the substrate 105 may be a p-type epitaxial layer. The DE-NMOS FET 101 includes an n-type source region 110 (also identified individually as n-type source regions 110*a/b*) formed within a p-type well region 115 (also identified individually as p-type well regions 115*a/b*). The p-type well region 115 includes a p-type region 116 (also identified individually as p-type regions 116*a/b*), which may be configured to provide a low resistance connection to the p-type well region 115. The n-type source region 110 is separated from the p-type region 116 by a field isolation structure 120 (also identified individually as field isolation structures 120*a/b*). In some embodiments, the field isolation structure 120 includes a shallow trench isolation (STI) structure.

The DE-NMOS FET 101 also includes an n-type drain region 125 formed within an n-type drain extension region 130 (which may be referred to as a drift or laterally diffused drain region). The n-type drain region 125 may include relatively greater dopant concentrations when compared to the n-type drain extension region 130. As such, the n-type drain region 125 and the drain extension region 130 can have graded dopant diffusion profiles. The n-type drain region 125 and the n-type drain extension region 130 may be referred to as a diffused drain region. The DE-NMOS FET 101 includes channel regions (denoted as L) between the n-type drain region 125 and the n-type source regions 110*a/b*.

The DE-NMOS FET 101 includes a gate oxide 135. In some embodiments, the gate oxide 135 may be suitable for supporting approximately 5 V to 6 V during operations— e.g., having a thickness to safely sustain approximately 5 V to 6 V. Moreover, the DE-NMOS FET 101 includes a field isolation structure 145 over the diffused drain region. In some embodiments, the field isolation structure 145 includes an oxide (a field oxide), which may be formed by local oxidation of silicon techniques (LOCOS). The DE-NMOS FET 101 includes a gate electrode 140 formed over the gate oxide 135 and over the field isolation structure 145. The gate electrode 140 includes an edge over the field isolation structure 145.

In some embodiments, the DE-NMOS FET 101 may have a ring-type configuration. For example, the field isolation structure 145 surrounds the n-type drain region 125, which forms a ring (a circle, a racetrack, or an obround shape). Moreover, the gate electrode 140 may surround the field isolation structure 145 with a portion of the gate electrode 140 disposed over the field isolation structure 145. Similarly, the p-type well region 115 (and the n-type source region 110 therein) may surround the n-type drain extension region 130 with a portion of p-type well region 115 underlapping a portion of the gate electrode 140.

Referring to FIG. 1B, the DE-PMOS FET 102 includes the substrate 105, which may be a p-type epitaxial layer in some embodiments. The DE-PMOS FET 102 includes a p-type source region 150 (also identified individually as p-type source regions 150a/b) within a n-type well region 155 (also identified individually as n-type well regions 155a/b). The n-type well region 155 includes an n-type region 156 (also identified individually as n-type regions 156a/b), which may be configured to provide a low resistance connection to the n-type well region 155. The p-type source region 150 is separated from the n-type region 156 by the field isolation structure 120 (also identified individually as field isolation structures 120c/d).

The DE-PMOS FET 102 includes a p-type drain region 160 formed within a p-type drain extension region 165 (which may be referred to as a drift or laterally diffused drain region). In some embodiments, the p-type drain extension region 165 can be concurrently formed with the p-well region 115 described with reference to FIG. 1A. The p-type drain region 160 may include relatively greater dopant concentrations when compared to the p-type drain extension region 165. As such, the p-type drain region 160 and the p-type drain extension region 165 can have graded dopant diffusion profiles. The p-type drain region 160 and the p-type drain extension region 165 may be referred to as a diffused drain region. The DE-PMOS FET 102 includes channel regions (denoted as L) between the p-type drain region 160 and the p-type source regions 150a/b.

The DE-PMOS FET 102 includes a gate oxide 170. In some embodiments, the gate oxide 170 and the gate oxide 135 are the same oxide—e.g., the gate oxides 135/170 being concurrently formed. Moreover, the DE-PMOS FET 102 includes the field isolation structure 145 over the diffused drain region. The DE-PMOS FET 102 includes a gate electrode 175 formed over the gate oxide 175 and over the field isolation structure 145. The gate electrode 175 includes an edge over the field isolation structure 145.

In some embodiments, the DE-PMOS FET 102 may have the ring-type configuration described with reference to the DE-NMOS FET 101. For example, the field isolation structure 145 surrounds the p-type drain region 160, which forms a ring (a circle, a racetrack, or an obround shape). Moreover, the gate electrode 175 may surround the field isolation structure 145 with a portion of the gate electrode 175 disposed over the field isolation structure 145. Similarly, the n-type well region 155 (and the p-type source region 150 therein) may surround the p-type drain extension region 165 with a portion of n-type well region 155 underlapping a portion of the gate electrode 175.

The graded dopant diffusion profiles of the diffused drain region of DE-NMOS FET 101 (or the DE-PMOS FET 102) may facilitate distributing an electric field across a relatively large area of the substrate 105. For example, a portion of the electric field between the drain and the source may be distributed across a relatively wide depletion region formed by the graded dopant diffusion profiles. Moreover, the field isolation structure 145, over which the drain-side edge of the gate electrode 140/175 is located, separates the gate electrode 140/175 from the drain regions (e.g., the n-type drain region 125, the p-type drain region 160) more efficiently than the gate oxide 135/170. In this manner, the drain region of the DE-NMOS FET 101 (or the DE-PMOS FET 102) can be configured to support relatively high voltages applied at the drain—e.g., voltages across the gate and the drain (Vgd), voltages across the drain and the source (Vds).

The source regions of the DE-NMOS FET 101 (or the DE-PMOS FET 102), however, includes neither the graded dopant diffusion profiles nor the field isolation structure 145. In some embodiments, Vgs that can be safely applied to the DE-NMOS FET 101 (or the DE-PMOS FET 102) may be less than a breakdown voltage of the gate oxide 135 (or the gate oxide 170). As such, the DE-NMOS FET 101 (or the DE-PMOS FET 102) may have a breakdown voltage across the gate and the source (BVgs) less than a breakdown voltage across the drain and the gate (BVgd) or a breakdown voltage across the drain and the source (BVds). In some embodiments, the DE-NMOS FET 101 (or the DE-PMOS FET 102) can support approximately 6 V or less applied across the gate and the source (i.e., Vgs being approximately 6 V or less) while approximately 20 V can be safely applied across the drain and the gate (or the source).

Figure 2:
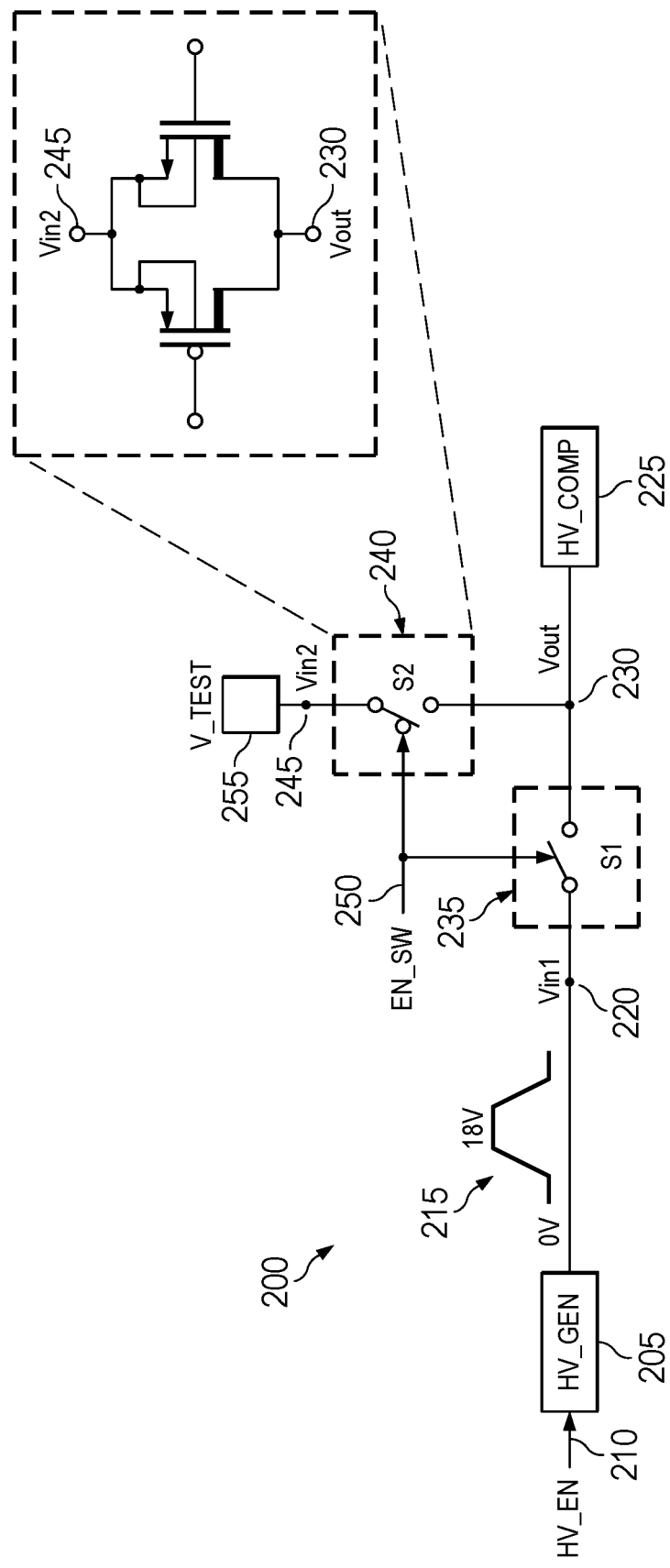
FIGS. 2 through 4 illustrate circuits including semiconductor switches for high voltage operations in accordance with embodiments of the present disclosure.

FIG. 2 illustrates a circuit 200 including semiconductor switches for high voltage operations in accordance with embodiments of the present disclosure. The circuit 200 includes a first component 205. In some embodiments, the first component 205 includes a high voltage generator (also denoted as HV_GEN). The first component 205 may include a voltage level shifter configured to generate an output voltage (e.g., 20 V) based on a voltage supply having a less voltage (e.g., 1.5 V) than the output voltage. A control signal 210 (also denoted as HV_EN) may be supplied to the first component 205 to enable or disable the first component 205. For example, the control signal 210 enables the first component 205 when the control signal is "high" (e.g., 1.5 V). Similarly, the control signal 210 disables the first component 205 when the control signal is "low" (e.g., 0 V). In response to receiving the control signal 210 enabling the first component 205, the first component 205 can generate a voltage signal 215 as an output. In some embodiments, the voltage signal 215 may include one or more voltage pulses varying between 0 V and 18 V (or 20 V).

The circuit 200 includes a second component 225 (also denoted as HV_COMP). In some embodiments, the second component 225 includes various components configured to utilize high voltage signals (e.g., the voltage signal 215 from the first component 205). For example, the second component 225 may include an array of EEPROM cells operating with relatively high voltages—e.g., approximately 18 V to 20 V to program or erase the EEPROM cells. The second component 225 may be coupled to a power supply node. For example, the second component 225 is coupled to a node 230, which may be regarded as a power supply node for the second component 225.

The circuit 200 includes a first switch 235 (also denoted as S1) located between the first component 205 and the second component 225. The first switch 235 has an input node and an output node. For example, the input node of the first switch 235 is coupled to the first component 205 at a node 220 (also denoted as Vin1). The output node of first switch 235 is coupled to the second component 225 at the node 230 (also denoted as Vout). The first switch 235 is configured to receive a control signal 250 (also denoted as EN_SW) configured to enable or disable the first switch 235.

Additionally, the circuit 200 includes a second switch 240 (also denoted as S2) located between a pad 255 and the second component 225. The second switch 240 includes an input node and an output node. For example, the input node of the second switch 240 is coupled to the pad 255 at a node 245 (also denoted as Vin2). Similarly, the output node of the second switch 240 is coupled to the second component 225 at the node 230 (Vout). The pad 255 may be coupled to an externally supplied voltage (also denoted as V_TEST). The second switch 240 is configured to receive the control signal 250 (EN_SW) configured to enable or disable the second switch 240.

The first switch 235 and the second switch 240 can be configured to be complementary to each other—e.g., opposite to each other. In other words, when the first switch 235 is enabled (e.g., in response to receiving the control signal EN_SW enabling the first switch 235), the second switch 240 is disabled. Similarly, when the first switch 235 is disabled (e.g., in response to receiving the control signal EN_SW disabling the first switch 235), the second switch 240 is enabled. As such, the node 230 (i.e., the power supply node for the second component 225) couples to either the first component 205 (i.e., the voltage signal 215) through the node 220 (Vin1) or to the pad 255 (i.e., the externally supplied voltage V_TEST) through the node 245 (Vin2). In this manner, the second component 225 (HV_COMP) may operate with the voltage signal 215 generated by the first component 205 (HV_GEN) when the first switch 235 is enabled or with the externally supplied voltage V_TEST when the second switch 240 is enabled.

The first switch 235 and the second switch 240 may provide flexibility for operating the second component 225. For example, during normal operations of the circuit 200 (or during design validation phases), the first switch 235 is enabled (e.g., using the control signal 250) such that the second component 225 can operate with the first component 205 utilizing the voltage signal 215. On the other hand, when the second component 225 is characterized or de-bugged (e.g., when the EEPROM cells exhibit unexpected behaviors), the second switch 240 can be enabled to provide the externally supplied voltage (V_TEST) while the first component 205 is isolated from the second component 225. For example, V_TEST may supply programming pulses with different timing parameters and/or different voltage levels than the voltage signal 215 for de-bugging or characterizing the EEPROM cells of the second component 225.

If the first switch 235 (or the second switch 240) were to be implemented directly with a DE-NMOS FET 101 and/or a DE-PMOS FET 102 (e.g., to pass the voltage signal 215 or V_TEST to the second component 225), the above-described asymmetry in the breakdown voltages (e.g., BVgs being less than BVgd or BVds) may hinder the DE-NMOS FET 101 and/or DE-PMOS FET 102 from safely operating without functionality and/or reliability issues. By way of example, as shown in the inset of FIG. 2, the second switch 240 may include a DE-NMOS FET and a DE-PMOS FET with their drains and sources tied together. The sources are further coupled to the node 245 and the drains to the node 230. The gate of the DE-NMOS FET and the gate of the DE-PMOS FET are configured to receive control signals that enable or disable the second switch 240.

When the control signals apply 20 V to the gate of the DE-NMOS FET and 0 V to the gate of the DE-PMOS FET to enable the second switch 240, Vgs of the DE-NMOS FET or the DE-PMOS FET may exceed BVgs (e.g., 6 V or so). For example, the DE-NMOS FET experiences Vgs of 20 V when V_TEST is 0 V, Similarly, the DE-PMOS FET experiences Vgs of 18 V when V_TEST is 18 V. As such, the DE-MOS FETs may be subject to operating conditions outside their SOA, thereby presenting functionality and/or reliability risks to the circuit 200.

Figure 3:
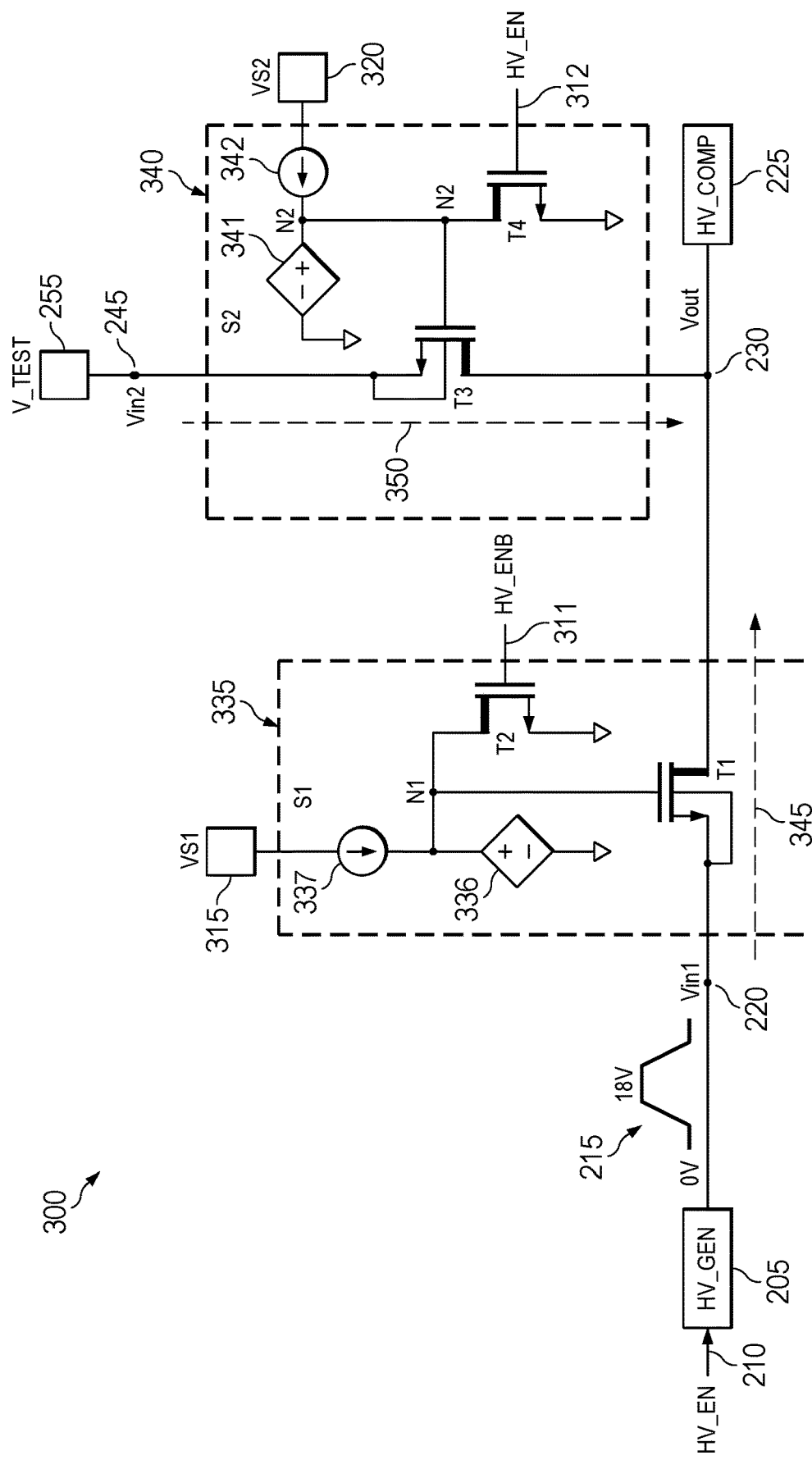

If the first switch 235 (or the second switch 240) were to be implemented with the circuit configurations described in more detail herein with reference to FIGS. 3 through 6, the DE-MOS FETs can operate within their SOA to avoid the functionality/reliability risks. FIG. 3 illustrates a circuit 300 including semiconductor switches for high voltage operations in accordance with embodiments of the present disclosure. The circuit 300 is generally similar to the circuit 200, and like reference numbers refer to like components of the circuit 200. The circuit 300 includes a first switch 335 and a second switch 340—e.g., the first switch 235 and the second switch 240 including DE-MOS FETs configured to operate within their SOA.

An input node of the first switch 335 is coupled to the node 220 (Vin1) and an output node of the first switch 335 is coupled to the node 230 (Vout). The first switch 335 is configured to receive a control signal 311 (also denoted as HV_ENB) configured to enable or disable the first switch 335. In some embodiments, the control signal 311 is complementary to (e.g., opposite to) the control signal 210. For example, when the control signal 210 is "high" (e.g., 1.5 V) to enable the first component 205, the control signal 311 is "low" (e.g., 0 V), which enables the first switch 335 (by deactivating T2 of the first switch 335), and vice versa. The first switch 335 is coupled to a first voltage supply 315 (also denoted as VS1).

Similarly, an input node of the second switch 340 is coupled to the node 245 (Vin2) and an output node of the second switch 340 is coupled to the node 230 (Vout). The second switch 340 is configured to receive a control signal 312 enabling or disabling the 340. In some embodiments, the control signal 312 corresponds to the control signal 210 (HV_EN)—e.g., when the control signal 210 is "low" (e.g., 0 V) to disable the first component 205, the control signal 312 is "low" (e.g., 0 V), which enables the second switch 340 (by deactivating T4 of the second switch 340), and vice versa. The second switch 340 is coupled to a second voltage supply 320 (also denoted as VS2).

The first switch 335 includes a first DE-NMOS FET (T1) and a second DE-NMOS FET (T2), both of which may be examples of or include aspects of the DE-NMOS FET 101 described with reference to FIG. 1A. T1 has a gate coupled to a node (also denoted as N1) of the first switch 335, as well as a source and a drain coupled to the input node and the output node of the first switch 335, respectively—i.e., the source coupled to Vin1 and the drain coupled to Vout. T2 has a drain coupled to N1 and a source coupled to a ground node. Moreover, T2 has a gate configured to receive the control signal 311 enabling or disabling the first switch 335.

The first switch 335 includes a voltage source 336 coupled to N1. The voltage source 336 is configured to generate a first voltage (e.g., the voltage at N1) greater than a second voltage at the input node (e.g., the voltage signal 215 at Vin1) by a predetermined amount ($\Delta V$). As such, the voltage source 336 may be referred to as a voltage dependent voltage source or a voltage-controlled voltage source. In this manner, Vgs of T1 can be maintained by the predetermined amount ($\Delta V$) that is configured to be less than BVgs of T1. Moreover, the predetermined amount ($\Delta V$) can be determined based at least in part on activating T1 to transfer the second voltage at the input node (e.g., the voltage signal 215 at Vin1) to the output node (Vout).

The first switch 335 includes a current source 337 with a first terminal coupled to N1 and a second terminal coupled to the first voltage supply 315. The first voltage supply 315 is configured to provide current to the current source 337. In some embodiments, the current source 337 corresponds to a DE-PMOS FET (e.g., the DE-PMOS FET 102 described with reference to FIG. 1B) of a current-mirror circuit as described in more detail with reference to FIG. 5.

When the control signal 311 enables the first switch 335 (e.g., the control signal 210 (HV_EN) is "high" to enable HV_GEN and the control signal 311 (HV_ENB) is "low"), T2 is deactivated (e.g., turns off). As a result of T2 being deactivated, the current of the current source 337 flows to the voltage source 336, which in turn, brings the voltage at N1 higher than the voltage at Vin1 by ΔV—e.g., Vgs of T1 corresponding to ΔV. In this manner, T1 is activated (e.g., turns on) to transfer the voltage at Vin1 (e.g., the voltage signal 215) to Vout.

When the control signal 311 disables the first switch 335 (e.g., the control signal 210 (HV_EN) is "low" to disable HV_GEN and the control signal 311 (HV_ENB) is "high"), T2 is activated (e.g., turns on). As a result of T2 being activated, the current of the current source 337 flows to T2 (eventually to the ground node). In this manner, T2 connects N1 to the ground node, which in turn deactivates T1 (e.g., turns off). As such, when the first switch 335 is disabled by the control signal 311, T1 isolates Vin1 from Vout.

In some embodiments, T2 is configured to have an equivalent resistance less than that of the voltage source 336 such that, when T2 is activated, T2 can shunt the current supplied by the current source 337 from flowing through the voltage source 336—e.g., T2 drawing the current from the current source 337. Additionally, or alternatively, T2 can be configured to have an equivalent resistance less than that of the current source 337 such that, when T2 is activated, T2 can bring the N1 node to a ground potential as T2 shunts the current to the ground node.

The second switch 340 may be configured to include the same circuit elements as the first switch 335 and operate in the same manner as the first switch 335. For example, the second switch 340 includes a third DE-NMOS FET (T3) and a fourth DE-NMOS FET (T4) (both of which may be examples of or include aspects of the DE-NMOS FET 101 described with reference to FIG. 1A), a voltage source 341 (which may be referred to as a voltage dependent voltage source or a voltage-controlled voltage source) configured to apply Vgs to T3 corresponding to a predetermined amount (e.g., ΔV), a current source 342 coupled to a second voltage supply 320 (also denoted as VS2). As with the first switch 335, when the second switch 340 is enabled (e.g., the control signal 312 (HV_EN) is "low" to deactivate T4 (and to disable HV_GEN)), T3 is activated to transfer the voltage at the node 245 (Vin2), i.e., V_TEST, to Vout. When the second switch 340 is disabled (e.g., the control signal 312 (HV_EN) is "high" to activate T4 (and to enable HV_GEN)), T3 is deactivated to isolate the voltage at the node 245 (Vin2) from Vout.

As described herein, when the first switch 335 is enabled (e.g., HV_ENB is "low"), the second switch 340 is disabled (e.g., HV_EN is "high") to isolate V_TEST from Vout. Thus, the voltage signal 215 is supplied to the second component 225 (as indicated by the arrow 345) such that the second component 225 can operate with the voltage signal 215 generated by the first component 205. Similarly, when the first switch 335 is disabled (e.g., HV_ENB is "high"), the second switch 340 is enabled (e.g., HV_EN is "low") to transfer V_TEST from Vin2 to Vout. Thus, V_TEST can be supplied to the second component 225 (as indicated by the arrow 350) such that the second component 225 can operate with V_TEST, which may be externally supplied to the second component 225. In this manner, the second component 225 can operate with either the voltage signal 215 generated by the first component 205 or with V_TEST supplied to the second component 225. Moreover, Vgs (e.g., ΔV) of T1 (or T3) can be predetermined to be less than BVgs of T1 (or T3) to avoid functionality/reliability risks thereto, and to sufficiently activate T1 (or T3) to transfer the voltage signal 215 (or V_TEST) to Vout, the power supply node of the second component 225 (e.g., EEPROM cells).

Figure 4:
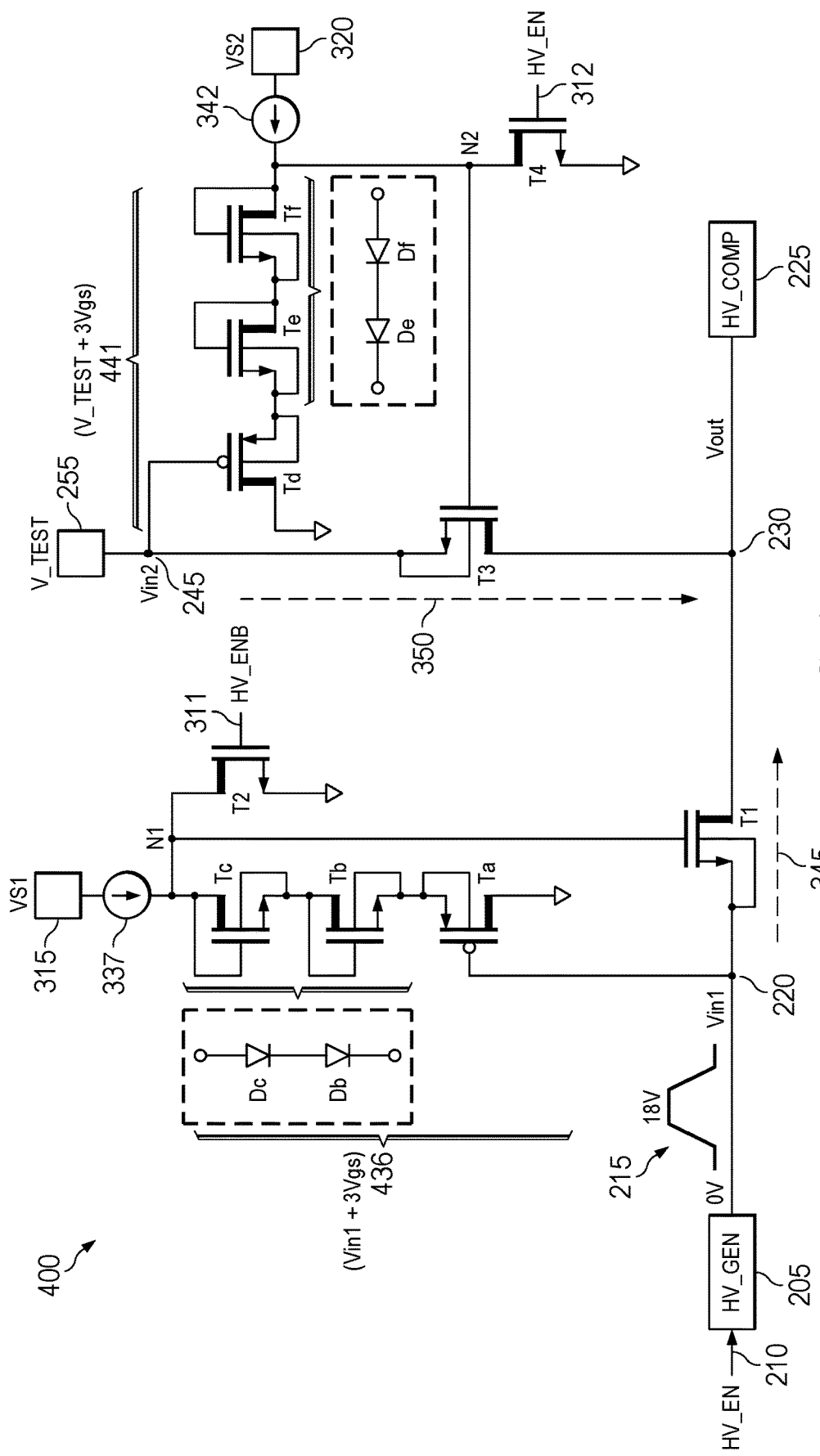

FIG. 4 illustrates a circuit 400 including semiconductor switches for high voltage operations in accordance with embodiments of the present disclosure. The circuit 400 is generally similar to the circuit 200 or the circuit 300, and like reference numbers refer to like components of the circuit 200 or the circuit 300. More specifically, the circuit 400 shows an example embodiment of the voltage source 336 (or the voltage source 341) for the semiconductor switches.

The circuit 400 includes a voltage source 436 and a voltage source 441—e.g., the voltage source 336 and the voltage source 341 configured to include DE-MOS FETs. The voltage source 436 includes a DE-PMOS FET (Ta, which may be an example of or include aspects of the DE-PMOS FET 102) with a gate coupled to an input node of the first switch (i.e., the node 220) and a drain coupled to a ground node. The voltage source 436 also includes two DE-NMOS FETs (Tb and Tc, each of which may be an example of or include aspects of the DE-NMOS FET 101) connected in series. Each of Tb and Tc has its drain connected to its gate. In this regard, Tb (or Tc) is configured to operate as a diode—i.e., Tb (or Tc) being equivalent to a diode Db (or a diode Dc) as shown in the inset of FIG. 4. Moreover, the source of Tb (i.e., a cathode of the diode Db) is connected to the source of Ta, and the drain of Tc (i.e., an anode of the diode Dc) is connected to the node N1.

When the current from the current source 337 flows through the first voltage source 436 to the ground node (i.e., T2 is deactivated), all of Ta, Tb, and Tc are activated (e.g., turn on). In other words, the voltage at N1 may be proportional to a total of individual Vgs values across Ta, Tb, and Tc in addition to the voltage at the node 220 (Vin1). In some embodiments, the total of individual Vgs values across Ta, Tb, and Tc may correspond to a total of (1) a threshold voltage of Ta and (2) a sum of threshold voltages of Tb and Tc. In this manner, Vgs of T1 can be configured to be greater than the voltage at the node 220 (Vin1) by the predetermined amount—e.g., 3 times the Vgs value (or the threshold voltage values) if the individual Vgs values (or the threshold voltage values) of Ta, Tb, and Tc are configured to be generally the same.

The DE-NMOS FETs of the first switch 335 (e.g., T1, Tb, and Tc) can be concurrently formed such that threshold voltages of the DE-NMOS FETs are generally the same. In other words, the threshold voltage values of Tb and Tc of the voltage source 436 can be configured to track the threshold voltage of T1. In this manner, the voltage source 436 can mitigate effects of variations in electrical characteristics of T1. For example, if the threshold voltage of T1 increases due to statistical process variations (e.g., due to thickness increases in the gate oxide 135), the threshold voltages of Tb and Tc also increases such that the predetermined amount (ΔV or 3×Vgs) also increases to compensate for the threshold voltage increase of T1—e.g., to suitably activate T1 despite the threshold voltage increase of T1. Similarly, if the threshold voltage of T1 decreases (e.g., due to thickness decreases in the gate oxide 135), the threshold voltages of Tb and Tc also decrease such that the predetermined amount (ΔV or 3×Vgs) decreases accordingly to avoid chances of Vgs of T1 approaching BVgs of T1, which may also have been reduced.

The voltage source 441 may be configured generally the same as the voltage source 436. For example, the voltage source 441 of the second switch 340 includes a DE-PMOS FET (Td) and two DE-NMOS FETs (Te and Tf) connected in series (or two diodes De and Df connected in series). Td in conjunction with Te and Tf may be configured to operate the same manner as described with Ta, Tb, and Tc of the voltage source 436. For example, the voltage at N2 may be proportional to a total of individual Vgs values across Td, Te, and Tf in addition to the voltage at the node 245 (Vin2). In this manner, Vgs of T3 can be configured to be greater than the voltage at the node 245 (Vin2) by the predetermined amount (ΔV)—e.g., 3 times the Vgs value (or the threshold voltage values) if individual Vgs values (or the threshold voltage values) of Td, Te, and Tf are configured to be generally the same.

Figure 5:
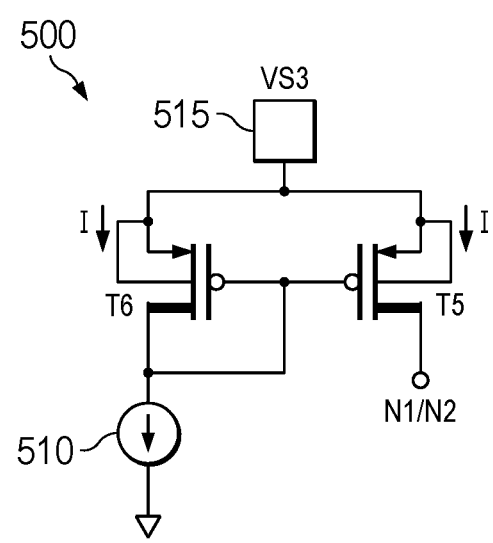
FIG. 5 is a current mirror circuit supporting semiconductor switches for high voltage operations in accordance with embodiments of the present disclosure.

FIG. 5 is a current mirror circuit 500 supporting semiconductor switches for high voltage operations in accordance with embodiments of the present disclosure. The circuit 500 includes DE-PMOS FETs T5 and T6, each of which may be an example of or include aspects of the DE-PMOS FET 102. Sources of T5 and T6 are connected to a voltage supply 515 (also denoted as VS3)—e.g., 20 V voltage supply. The drain of T6 is connected to an internal current source 510—e.g., 1 μA current source. In this manner, T5 is configured to flow the same amount of current (also denoted as I in FIG. 5) (e.g., 1 μA) when T6 flows the current that the internal current source 510 draws. The drain of T5 is connected to the node N1 (or the node N2) of the first switch 335 (or the second switch 340).

The current mirror circuit 500 may be configured to supply a suitable amount of current to the voltage source 336 (or the voltage source 341) when the first switch 335 (or the second switch 340) is enabled such that the voltage source 336 (or the voltage source 341) can provide an adequate bias voltage to T1 (or T3). For example, the current mirror circuit 500 supplies the current to activate all three DE-MOS FETs Ta, Tb, and Tc of the voltage source 436 (or the DE-MOS FETs Td, Te, and Tf of the voltage source 441) such that the voltage source 436 (or the voltage source 441) can supply 3 times Vgs (or the predetermined amount ΔV) across the gate and the source of T1 (or T3) as described herein. Additionally, the current mirror circuit 500 may be configured to have an equivalent resistance greater than an equivalent resistance of T2 (or T4) such that the node N1 (or the node N2) can be brought to a ground potential to deactivate T1 (or T3) when the first switch 335 (or the second switch 340) is disabled—e.g., T2 (or T4) is activated to shunt (or steer) the current from flowing to the voltage source 336 (or the voltage source 341).

Figure 6:
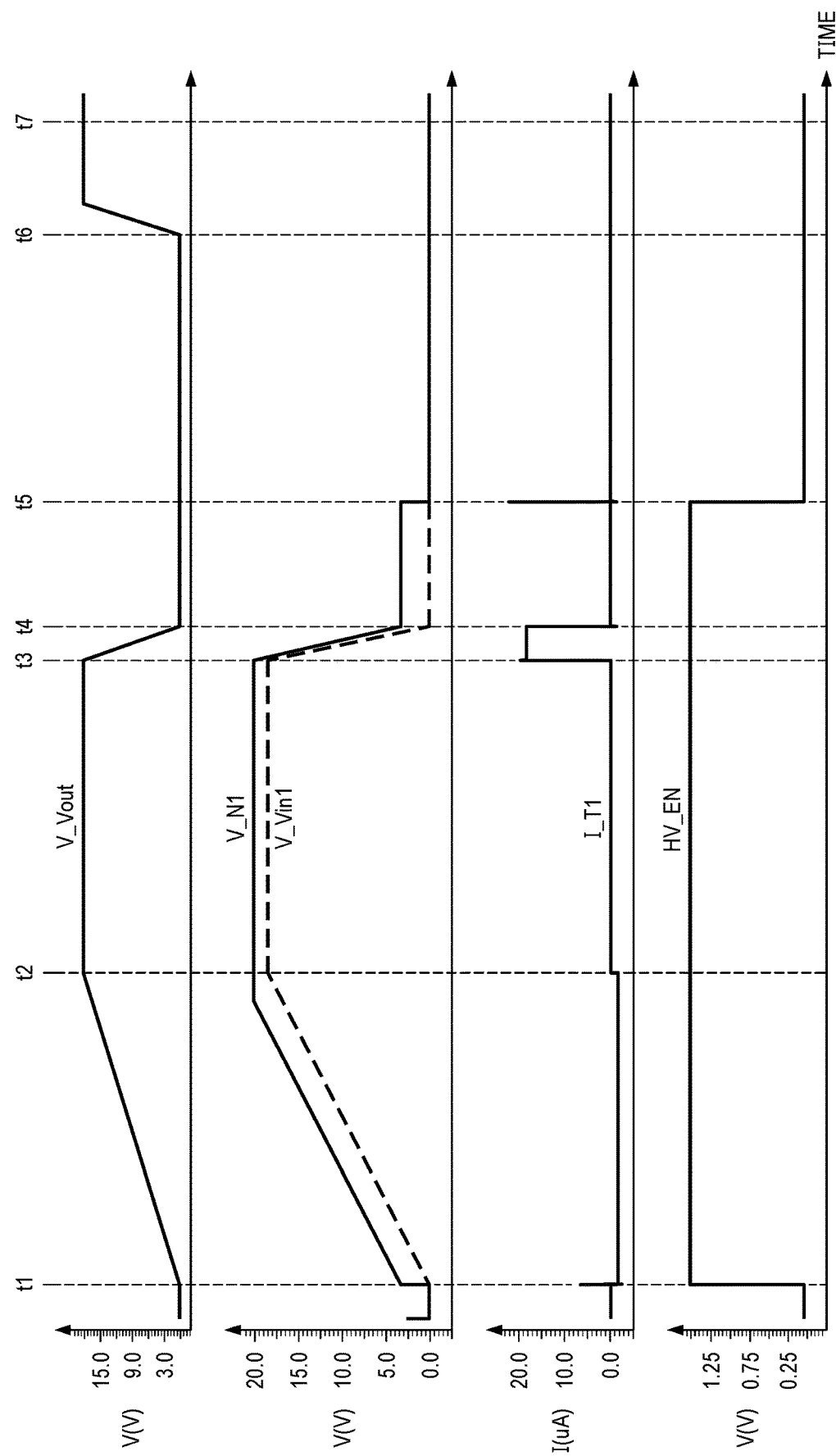
FIG. 6 illustrates example voltage/current timing diagrams of operations associated with semiconductor switches for high voltage operations in accordance with aspects of the present disclosure.

FIG. 6 illustrates example voltage/current timing diagrams of operations associated with semiconductor switches for high voltage operations in accordance with aspects of the present disclosure. FIG. 6 shows a voltage waveform (the control signal 210, e.g., HV_EN) that controls the first component 205 (e.g., HV_GEN), the first switch 335 (e.g., the control signal 311 (HV_ENB opposite to HV_EN)), and the second switch 340 (e.g., the control signal 312 corresponding to HV_EN), a current waveform (I_T1) flowing through T1, a voltage waveform (V_Vin1) at the node 220 (Vin1), a voltage waveform (V_N1) at the node N1 of the first switch 335, and a voltage waveform (V_Vout) at the node 230 (Vout).

During a first period between time t1 and t5, HV_EN is "high." Accordingly, the first component 205 is enabled to generate V_Vin1 at the node 220. Additionally, the first switch 335 is enabled (e.g., HV_ENB deactivating T2), and the second switch 340 is disabled (e.g., HV_EN activating T4). As such, the voltage source 336 (or the voltage source 436) provides V_N1 at the node N1, which is greater than V_Vin1 by the predetermined amount—e.g., ΔV, 3 times Vgs (V_N1 is limited not to exceed 20 V during this analysis). In other words, V_N1 tracks V_Vin1 by the predetermined amount as shown in FIG. 6. In this manner, T1 of the first switch 335 is adequately biased (within the SOA) to transfer V_Vin1 at the node 220 to the node 230 (Vout), which is the voltage supply node for the second component 225 (e.g., HV_COMP). As a result, the second component 225 can operate with V_Vout corresponding to V_Vin1 generated by the first component 205.

During a second period between time t5 and t7 (and on), HV_EN is "low." Accordingly, the first component 205 is disabled. Additionally, the first switch 335 is disabled (e.g., HV_ENB activating T2), and the second switch 340 is enabled (e.g., HV_EN deactivating T4). As such, the voltage source 341 (or the voltage source 441) adequately biases T3 to transfer V_TEST at the node 245 (Vin2) to the node 230 (Vout). Thus, V_Vout after time t5 corresponds to V_TEST, which may be externally supplied. As a result, the second component 225 can operate with V_TEST through the second switch 340. After time t5, T1 of the disabled first switch 335 isolates the node 230 (Vout) from the first component 205—e.g., HV_COMP being isolated from HV_GEN. For example, although V_Vout increases from 0 V to 18 V at time t6, no appreciable current is shown to flow through T1 as shown in I_T1, for example at time t7.

Although the foregoing example circuit (e.g., the circuit 400) includes two diodes (e.g., two DE-NMOS FETs configured to operate as diodes) in series for the voltage source of the switch (i.e., the voltage dependent voltage source or the voltage-controlled voltage source of the switch), the present disclosure is not limited thereto. For example, the voltage source (e.g., the voltage source 336, 341, 436, or 441) may include one diode (or one DE-NMOS FET configured to operate as a diode), three diodes (or three DE-NMOS FETs connected in series, each of which is configured to operate as a diode), or even greater. Moreover, although the foregoing example DE-MOS FETs (e.g., DE-NMOS FET 101, DE-PMOS FET 102) are described as a ring-type FET with two channel regions located both sides of the drain region as shown in FIGS. 1A/1B, the present disclosure is not limited thereto. For example, DE-MOS FETs may include one channel region located between a drain region and a source region.

While various embodiments of the present disclosure have been described above, it is to be understood that they have been presented by way of example and not limitation. Numerous changes to the disclosed embodiments can be made in accordance with the disclosure herein without departing from the spirit or scope of the present disclosure. For example, one or more DE-NMOS FETs may be replaced with DE-PMOS FETs in conjunction with suitable modifications in circuit configurations, and vice versa. In addition, while in the illustrated embodiments various features or components have been shown as having particular arrangements or configurations, other arrangements and configurations are possible. Moreover, aspects of the present technology described in the context of example embodiments may be combined or eliminated in other embodiments. Thus, the breadth and scope of the present disclosure is not limited by any of the above described embodiments.

What is claimed is:

1. A circuit, comprising:
a Diffusion-Enhanced N-channel Metal-Oxide-Semiconductor Field Effect Transistor (DE-NMOS FET) including a gate coupled to a node of the circuit, wherein a source and a drain of the DE-NMOS FET are coupled to an input node and an output node of the circuit, respectively;
a voltage source coupled to the node, wherein the voltage source is configured to provide a first voltage at the node, the first voltage greater than a second voltage at the input node by a predetermined amount; and
a current source coupled to the node, the current source configured to supply current to the voltage source.

2. The circuit of claim 1, wherein the predetermined amount is less than a breakdown voltage across the gate and source (BVgs) of the DE-NMOS FET.

3. The circuit of claim 2, wherein the BVgs of the DE-NMOS FET is less than a breakdown voltage across the drain and gate (BVdg) of the DE-NMOS FET or a breakdown voltage across the drain and source (BVds) of the DE-NMOS FET.

4. The circuit of claim 1, wherein the predetermined amount corresponds to a voltage applied across the gate and source (Vgs) of the DE-NMOS FET that activates the DE-NMOS FET to transfer the second voltage to the output node.

5. The circuit of claim 1, wherein the voltage source comprises:
a Diffusion-Enhanced P-channel Metal-Oxide-Semiconductor Field Effect Transistor (DE-PMOS FET) with a gate coupled to the input node and a drain coupled to a ground node; and
one or more diodes connected in series, wherein a source of the DE-PMOS FET is coupled to a cathode of a first diode of the one or more diodes.

6. The circuit of claim 5, wherein an anode of a second diode of the one or more diodes is coupled to the node.

7. The circuit of claim 6, wherein the first diode corresponds to the second diode.

8. The circuit of claim 5, wherein the predetermined amount is proportional to a total of a threshold voltage of the DE-PMOS FET and a sum of threshold voltages of the one or more diodes.

9. The circuit of claim 5, wherein the DE-NMOS FET is a first DE-NMOS FET, and each diode of the one or more diodes corresponds to a second DE-NMOS FET with a drain and a gate connected together.

10. The circuit of claim 9, wherein the first DE-NMOS FET has a first threshold voltage and each one of the second DE-NMOS FETs has a second threshold voltage same as the first threshold voltage.

11. The circuit of claim 1, wherein the current source corresponds to a DE-PMOS FET of a current-mirror circuit, and wherein a source and a drain of the DE-PMOS FET are coupled to a voltage supply and to the node, respectively.

12. The circuit of claim 1, wherein the DE-NMOS FET is a first DE-NMOS FET, and the circuit further comprises:
a second DE-NMOS FET with a drain coupled to the node, wherein a gate of the second DE-NMOS FET is configured to receive a signal enabling or disabling the circuit.

13. The circuit of claim 12, wherein the current source is configured to supply the current to the voltage source in response to the signal enabling the circuit applied at the gate of the second DE-NMOS FET.

14. The circuit of claim 12, wherein the first DE-NMOS FET is configured to transfer the second voltage at the input node to the output node in response to the signal enabling the circuit applied at the gate of the second DE-NMOS FET.

15. The circuit of claim 12, wherein the first DE-NMOS FET is configured to isolate the output node from the input node in response to the signal disabling the circuit applied at the gate of the second DE-NMOS FET.

16. The circuit of claim 12, wherein the second DE-NMOS FET is configured to draw the current from the current source in response to the signal disabling the circuit applied at the gate of the second DE-NMOS FET.

17. The circuit of claim 12, wherein the second DE-NMOS FET is configured to couple the gate of the first DE-NMOS FET to a ground node in response to the signal disabling the circuit applied at the gate of the second DE-NMOS FET.

18. A circuit, comprising:
a first component including an output node, the first component configured to generate a first voltage at the output node;
a second component coupled to a power supply node, the second component configured to operate with the first voltage; and
a first switch connected between the output node and the power supply node, wherein the first switch includes:
a first Diffusion-Enhanced N-channel Metal-Oxide-Semiconductor Field Effect Transistor (DE-NMOS FET) including a gate coupled to a first node of the first switch, wherein a source and a drain of the first DE-NMOS FET are coupled to the output node and the power supply node, respectively;
a first voltage source coupled to the first node, wherein the first voltage source is configured to generate a second voltage greater than the first voltage by a first predetermined amount; and
a first current source coupled to the first node, the first current source configured to supply first current to the first voltage source.

19. The circuit of claim 18, wherein the first predetermined amount corresponds to a voltage applied across the gate and source (Vgs) of the first DE-NMOS FET that activates the first DE-NMOS FET to transfer the first voltage to the power supply node.

20. The circuit of claim 18, wherein the first voltage source comprises:
a Diffusion-Enhanced P-channel Metal-Oxide-Semiconductor Field Effect Transistor (DE-PMOS FET) with a gate coupled to the output node and a drain coupled to a ground node; and
one or more diodes connected in series, wherein a source of the DE-PMOS FET is coupled to a cathode of a first diode of the one or more diodes.

21. The circuit of claim 20, wherein each diode of the one or more diodes corresponds to a DE-NMOS FET including a drain connected to its gate.

22. The circuit of claim 21, wherein the first DE-NMOS FET has a first threshold voltage and each one of the DE-NMOS FETs has a second threshold voltage same as the first threshold voltage.

23. The circuit of claim 18, wherein the first switch further comprises:

a second DE-NMOS FET with a drain coupled to the first node, wherein a gate of the second DE-NMOS FET is configured to receive a first signal enabling or disabling the first switch.

24. The circuit of claim 23, wherein the first DE-NMOS FET is configured to transfer the first voltage at the output node to the power supply node in response to the first signal enabling the first switch applied at the gate of the second DE-NMOS FET.

25. The circuit of claim 23, wherein the first DE-NMOS FET is configured to isolate the output node from the power supply node in response to the first signal disabling the first switch applied at the gate of the second DE-NMOS FET.

26. The circuit of claim 23, further comprising a second switch connected between the power supply node and a pad connected to an external power source configured to supply a third voltage at the pad, wherein the second switch includes:
  a third DE-NMOS FET including a gate coupled to a second node of the second switch, wherein a source and a drain of the third DE-NMOS FET are coupled to the pad and the power supply node, respectively;
  a fourth DE-NMOS FET with a drain coupled to the second node, wherein a gate of the fourth DE-NMOS FET is configured to receive a second signal enabling or disabling the second switch;
  a second voltage source coupled to the second node, wherein the second voltage source is configured to generate a fourth voltage greater than the third voltage by a second predetermined amount; and
  a second current source coupled to the second node, the second current source configured to supply second current to the second voltage source.

27. The circuit of claim 26, wherein:
  when the first signal enables the first switch, the second signal disables the second switch; and
  when the second signal enables the second switch, the first signal disables the first switch.

28. The circuit of claim 26, wherein the third DE-NMOS FET is configured to transfer the third voltage to the power supply node in response to the second signal enabling the second switch applied at the gate of the fourth DE-NMOS FET.

29. The circuit of claim 26, wherein the third DE-NMOS FET is configured to isolate the pad from the power supply node in response to the second signal disabling the second switch applied at the gate of the fourth DE-NMOS FET.

30. The circuit of claim 18, wherein the first component includes a voltage level shifter configured to generate the first voltage based on a third voltage less than the first voltage.

31. The circuit of claim 18, wherein the second component includes an array of electrically erasable programmable read-only memory (EEPROM) cells.

32. A method, comprising:
  determining to supply a first voltage or a second voltage to a power supply node of a component; and
  enabling either a first switch configured to couple the first voltage to the power supply node or a second switch configured to couple the second voltage to the power supply node based at least in part on the determination, wherein each of the first and second switch includes:
    a Diffusion-Enhanced N-channel Metal-Oxide-Semiconductor Field Effect Transistor (DE-NMOS FET) having a gate coupled to a node of the switch, wherein a source and a drain of the DE-NMOS FET is coupled to an input node and an output node of the switch, respectively;
    a voltage source coupled to the node, wherein the voltage source is configured to generate a voltage greater than an input voltage of the input node by a predetermined amount; and
    a current source coupled to the node, the current source configured to supply current to the voltage source.

33. The method of claim 32, wherein:
  the input node of the first switch is coupled to the first voltage and the output node of the first switch is coupled to the power supply node; and
  the input node of the second switch is coupled to the second voltage and the output node of the second switch is coupled to the power supply node.

34. The method of claim 32, wherein the DE-NMOS FET is a first DE-NMOS FET, and each of the first and second switch further comprises:
  a second DE-NMOS FET with a drain coupled to the node, wherein a gate of the second DE-NMOS FET is configured to receive a signal enabling or disabling the switch.

35. The method of claim 34, wherein enabling the first switch comprises:
  applying a first signal configured to enable the first switch at the gate of the second DE-NMOS FET of the first switch; and
  applying a second signal configured to disable the second switch at the gate of the second DE-NMOS FET of the second switch, wherein the first and second signals are opposite to each other.

36. The method of claim 34, wherein enabling the second switch comprises:
  applying a first signal configured to disable the first switch at the gate of the second DE-NMOS FET of the first switch; and
  applying a second signal configured to enable the second switch at the gate of the second DE-NMOS FET of the second switch, wherein the first and second signals are opposite to each other.

37. The method of claim 32, wherein supplying the first voltage to the power supply node comprises:
  applying a control signal that enables a voltage level shifter configured to generate the first voltage based on a third voltage less than the first voltage; and
  applying a signal that enables the first switch, the signal being opposite to the control signal.

38. The method of claim 32, wherein supplying the second voltage to the power supply node comprises:
  applying a control signal that disables a voltage level shifter configured to generate the first voltage based on a third voltage less than the first voltage; and
  applying a signal that enables the second switch, the signal corresponding to the control signal, wherein the second voltage is externally supplied.

39. The method of claim 32, wherein the voltage source comprises:
  a Diffusion-Enhanced P-channel Metal-Oxide-Semiconductor Field Effect Transistor (DE-PMOS FET) with a gate coupled to the input node and a drain coupled to a ground node; and
  one or more diodes connected in series, wherein a source of the DE-PMOS FET is coupled to a cathode of a first diode of the one or more diodes.

40. The method of claim 39, wherein the DE-NMOS FET is a first DE-NMOS FET, and wherein each diode of the one or more diodes corresponds to a second DE-NMOS FET including a drain connected to its gate.

41. The method of claim 40, wherein the first DE-NMOS FET has a first threshold voltage and each one of the second DE-NMOS FETs has a second threshold voltage same as the first threshold voltage.

42. The method of claim 32, wherein the component includes an array of electrically erasable programmable read-only memory (EEPROM) cells configured to operate with either the first voltage or the second voltage.

* * * * *